United States Patent
Kaida

[11] Patent Number: 6,014,799
[45] Date of Patent: Jan. 18, 2000

[54] METHOD OF MANUFACTURING A PIEZOELECTRIC RESONATOR

[75] Inventor: Hiroaki Kaida, Moriyama, Japan

[73] Assignee: Murata Manufacturing Co., Ltd., Japan

[21] Appl. No.: 09/264,096

[22] Filed: Mar. 8, 1999

[30] Foreign Application Priority Data

Mar. 10, 1998 [JP] Japan .................................. 10-058454

[51] Int. Cl.[7] .................................................. H01L 41/22
[52] U.S. Cl. .......................... 29/25.35; 310/365; 427/100
[58] Field of Search .......................... 29/25.35; 427/100; 310/365, 366

[56] References Cited

U.S. PATENT DOCUMENTS 5,611,129  3/1997  Yoshimoto et al. .................... 29/25.35
5,622,748  4/1997  Takeuchi et al. ................... 29/25.35 X

*Primary Examiner*—Carl E. Hall
*Attorney, Agent, or Firm*—Graham & James LLP

[57] ABSTRACT

A piezoelectric resonator is manufactured by providing a first mother substrate in which first strip electrodes are formed such that they extend in a second direction that is substantially perpendicular to a first direction, wherein a direction of a line extending between an excitation electrode and a lead electrode is a first direction. A second mother substrate is produced by cutting the first mother substrate at a cutting position such that the length of the first strip electrodes as measured in the first direction achieves an accurate and ideal electrode overlapping length for a target resonance frequency. The second strip electrodes are formed on the resultant second mother substrate using a mask and then the second mother substrate is cut thereafter.

18 Claims, 7 Drawing Sheets

METHOD OF MANUFACTURING A PIEZOELECTRIC RESONATOR

I. BACKGROUND OF THE INVENTION

1. Field of the Invention

The present invention relates to a method of manufacturing a piezoelectric resonator, for use in an oscillator, for example, and more particularly, to an energy-trap type piezoelectric resonator in which a plurality of excitation electrodes are arranged so as to overlap each other with a piezoelectric body disposed therebetween.

2. Description of the Related Art

One type of conventional energy-trap type piezoelectric resonator has a first excitation electrode and a second excitation electrode arranged on respective major surfaces of a piezoelectric plate such that a first excitation electrode and a second excitation electrode overlap each other with the piezoelectric plate disposed therebetween so as form an excitation portion at the overlapping electrode area. Another conventional resonator is a laminated energy-trap type piezoelectric resonator having at least one internal electrode in which excitation electrodes are arranged on the piezoelectric surface to overlap each other with the internal electrode and a piezoelectric layer disposed therebetween, as disclosed in Japanese Patent Publication (kokoku) No. 7-105686.

In such piezoelectric resonators, the resonance frequency depends upon the thickness of a piezoelectric body. For this reason, in order to produce piezoelectric resonators having different resonance frequencies, a thickness of the piezoelectric bodies is selected according to the desired resonance frequency.

Resonance characteristics of a piezoelectric resonator vary in accordance with the excitation portion defined by the electrode overlapping area of the excitation electrodes. Therefore, first the thickness of a piezoelectric body has to be determined, and then the overlapping area of excitation electrodes is adjusted to a provide an optimum area to achieve excellent resonance characteristics at an arbitrary resonance frequency. The optimum overlapping area of excitation electrodes varies in accordance with the resonance frequency.

Accordingly, in order to realize excellent resonance characteristics at an arbitrary resonance frequency, a piezoelectric body having a thickness corresponding to the resonance frequency must first be provided and subsequently, excitation electrodes must be provided to obtain the an accurate and ideal overlapping area of excitation electrodes in the piezoelectric resonator.

However, during the manufacture of conventional piezoelectric resonators, a plurality of excitation electrodes are usually formed simultaneously on a mother substrate made of a piezoelectric material. This will be described with reference to an example of a method of manufacturing a conventional piezoelectric resonator 70 adapted to vibrate in a thickness shear vibration mode, as depicted in FIG. 13.

When a piezoelectric resonator 70 is manufactured, strip electrodes are arranged with gaps therebetween on the upper surface and the bottom surface of a mother substrate made of a piezoelectric material. The strip electrodes on the upper surface are arranged in order to define an excitation electrode 72a and a lead electrode 72b, depicted in FIG. 13, whereas the strip electrodes on the bottom surface are arranged to define an excitation electrode 72c and a lead electrode 72d.

The strip electrodes on the upper surface of the mother substrate and the strip electrodes on the bottom surface of the same mother substrate overlap each other with a portion of the mother substrate disposed therebetween to thereby have an overlapping length L defined between the excitation electrodes 72a and 72c. The mother substrate is then cut in the direction of a line which connects the excitation electrode 72a and the lead electrode 72b and also in the direction perpendicular to the line, to thereby obtain the piezoelectric resonator 70.

In the piezoelectric resonator 70, the lead electrodes 72b and 72d extend in opposite directions from the excitation portions on a piezoelectric body 71 polarized in the direction of an arrow P. The lead electrode 72b is provided so as to extend to an edge surface 71a, and the lead electrode 72d is provided so as to extend to an edge surface 71b.

As described above, the conventional energy-trap type piezoelectric resonator 70 has generally been manufactured by simultaneously forming a plurality of strip electrodes on respective surfaces of the mother substrate.

As mentioned above, in order to obtain excellent characteristics at a specific resonance frequency, an overlapping area between the excitation electrodes in a piezoelectric resonator, i.e., an overlapping length L between the excitation electrodes 72a and 72c in the piezoelectric resonator 70, must be optimized. Therefore, in the case in which piezoelectric resonators having a variety of frequencies are to be manufactured, after strip electrodes are formed on a mother substrate, for each frequency a separate mask must be provided in order to achieve an optimum electrode overlapping length L for each resonator.

However, the cost to provide a variety of masks corresponding to the respective resonance frequencies is considerably high. Thus, in practice, the frequencies are divided into several frequency ranges and a common mask is used in one frequency range, to thereby form the above-described strip electrodes on a mother substrate.

This process and use of one mask for different resonant frequencies in each of the ranges causes the electrode overlapping length L to be inaccurate and not suitable for some of the resonance frequencies. When an electrode overlapping length L is designated so as to correspond to a specific resonance frequency in a certain frequency range, the electrode overlapping length is not particularly suited for the other resonance frequencies in that range, and therefore, excellent resonance characteristics are only achieved for one of the resonant frequencies in the given range and the other resonant frequencies do not provide excellent resonance characteristics.

II. SUMMARY OF THE INVENTION

To overcome the problems described above, preferred embodiments of the present invention provide a method of manufacturing a piezoelectric resonator having excellent resonance characteristics, which method achieves precise and exact electrode overlapping for any desired resonance frequency using only one kind of mask for forming electrodes and achieves an ideal electrode overlapping area which corresponds exactly to each of a variety of resonance frequencies.

One preferred embodiment of the present invention provides a method of manufacturing a piezoelectric resonator including a piezoelectric body, a plurality of first and second excitation electrodes overlapping each other such that the piezoelectric body is located therebetween so as to define an excitation portion, a first lead electrode extending from the corresponding first excitation electrodes to an edge portion of the piezoelectric body and connected to a first electric potential, and a second lead electrode extending in a direction opposite from the direction in which said first lead electrode extends and connected to a second electric potential, the method including the steps of providing a first mother substrate on which a plurality of first strip electrodes are formed with gaps therebetween along a first direction and extending along a second direction, wherein the first direction is along a direction of a line which extends between the excitation electrodes and lead electrodes and the second direction is substantially perpendicular to the first direction, obtaining a second mother substrate by cutting the first mother substrate along the second direction such that the length of the first strip electrodes in the first direction is commensurate with a target resonance frequency, forming, by use of a mask, a plurality of second strip electrodes on a major surface of the second mother substrate, each of the second strip electrodes constituting the second excitation electrode and the second lead electrode connected to the second electric potential along the second direction; and obtaining a plurality of piezoelectric resonators by cutting the second mother substrate along the first direction.

According to the above described method, a plurality of piezoelectric resonators are obtained. The length in the first direction of the first strip electrode connected to the first electric potential is determined by changing the cutting position during a cutting step in the production of a second mother substrate. Since the length in the first direction of the first excitation electrode connected to the first electric potential is regulated in a finally obtained piezoelectric resonator during the cutting step in the production of a second mother substrate, the length of excitation electrodes overlapping each other is easily regulated to an appropriate length to thereby realize excellent resonance characteristics at a variety of frequencies.

Furthermore, during formation of the above-described second strip electrodes in which the second excitation electrodes connected to the second electric potential and the second lead electrodes are aligned in the second direction, only type of mask may be used even if there are changes in a resonance frequency and corresponding overlapping length required. As a result, the number and kinds of masks used in this step is reduced to one.

In the above described method, the piezoelectric body may have an elongated strip shape, and the longitudinal direction thereof corresponds to the first direction.

According to the above described arrangement, a plurality of piezoelectric resonators can be manufactured easily using first and second mother substrates.

In the above-described method, the plurality of first strip electrodes may be disposed on a first major surface of the first mother substrate and the plurality of second strip electrodes are disposed on a second major surface of the second mother substrate in the step of forming the plurality of second strip electrodes by use of a mask.

According to the above-described method, a single-plane-type energy-trap type piezoelectric resonator which is adapted to vibrate in a thickness extensional vibration mode or a thickness shear vibration mode, for example, is manufactured.

In the above described method, the first mother substrate may be polarized in a thickness direction thereof to thereby provide a piezoelectric resonator adapted to vibrate in a thickness extensional vibration mode.

In the above described method, the first mother substrate may be polarized in the first direction to thereby provide a piezoelectric resonator adapted to vibrate in a shear mode.

In the above described method, the first strip electrodes may be arranged to function as internal electrodes, the second strip electrodes may be disposed on first and second major surfaces of said second mother substrate during the step of forming the plurality of second strip electrodes by use of a mask, and thereby, a piezoelectric resonator which is adapted to vibrate in a harmonic of a thickness extensional vibration mode is obtained.

According to the above described method, it is possible to obtain an energy-trap type piezoelectric resonator adapted to vibrate in a high harmonic of a thickness extensional vibration mode. Therefore, there is provided a small-size piezoelectric resonator which can be used in a high frequency range.

Other features and advantages of the present invention will become apparent from the following description of the invention which refers to the accompanying drawings.

III. BRIEF DESCRIPTION OF DRAWINGS

IV. DETAILED DESCRIPTION OF PREFERRED EMBODIMENTS

A first preferred embodiment of the present invention will be described with reference to FIGS. 1 through 4.

Figure 1:
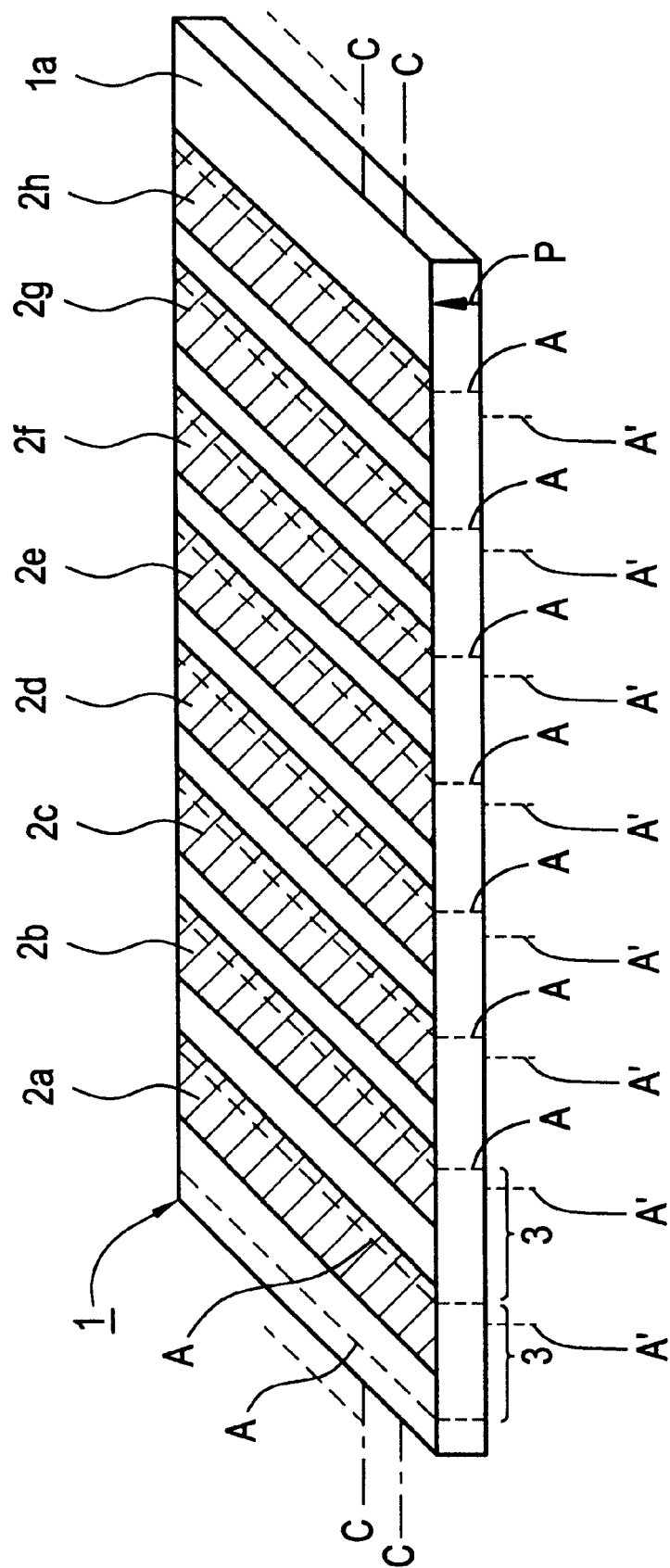
FIG. 1 is a perspective view depicting a first mother substrate provided in a first preferred embodiment.

First, a mother substrate 1, a perspective view of which is shown in FIG. 1, is provided. The mother substrate 1 is preferably formed of, for example, piezoelectric ceramic such as a PZT ceramic and preferably has a substantially rectangular shape.

The mother substrate 1 is polarized in a thickness direction indicated by an arrow P in FIG. 1. On a first major surface of the mother substrate 1, i.e., an upper surface 1a, first strip electrodes 2a through 2h are arranged substantially parallel to each other with gaps therebetween. A direction in which each of the first strip electrodes extends is designated as a second direction, and a direction which is substantially perpendicular to the second direction is designated as a first direction along which the first strip electrodes are juxtaposed to one another. In order to provide the first strip electrode 2a, an electrically conductive material may be provided by a thin film formation method such as vapor deposition or sputtering performed using a mask placed on the upper surface 1a of the mother substrate 1. With regard to the materials forming the first strip electrodes 2a through 2h, appropriate metal materials such as Ni or Cu may be used.

Subsequently, the first mother substrate 1 is cut at positions indicated by broken lines A in FIG. 1. The lines A are substantially parallel to the second direction.

As described below, an interval between cutting positions A is determined so as to provide an ideal and precise electrode overlapping length L of a piezoelectric resonator which is finally obtained and which corresponds to a target resonance frequency.

As described above, a plurality of second mother substrates 3 are obtained by cutting at the cutting positions A.

Figure 2:
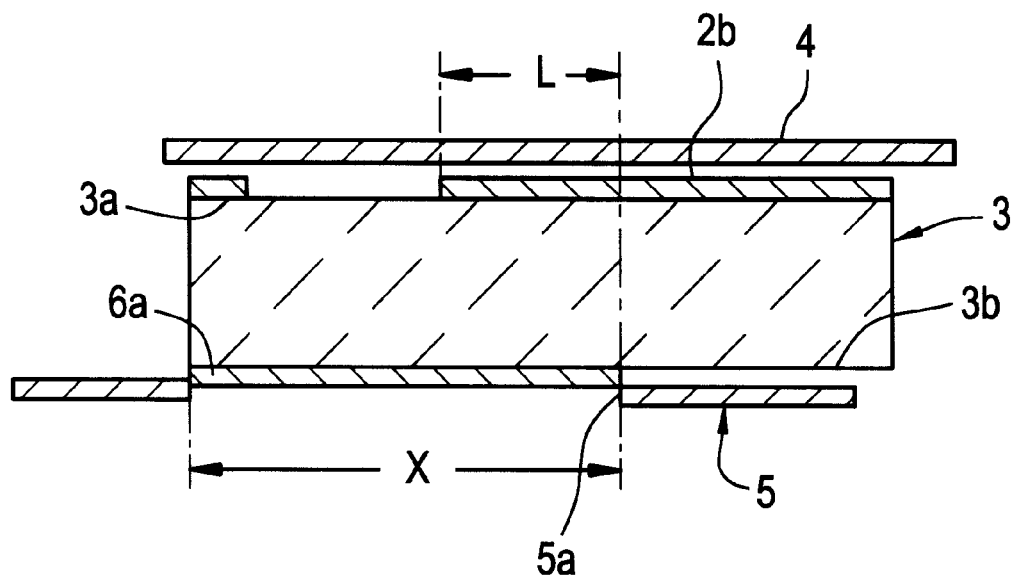
FIG. 2 is a cross-sectional view provided for illustrating the step of forming an electrode on the bottom surface of a second mother substrate cut from a first mother substrate.

As shown in FIG. 2, which shows a cross-section taken along the first direction, a mask 4 and a mask 5 are brought into contact with the upper surface and the bottom surface of the second mother substrate 3, respectively, and an electrically conductive material is provided through a thin film formation method such as vapor deposition or sputtering, to thereby form a second strip electrode 6a.

The mask 4 is designed so as to completely cover the entirety of the upper surface 3a of the second mother substrate 3 in order to avoid deposition of an electrode material on the surface 3a.

A second electrode 6a is formed in accordance with the shape of a window 5a of the mask 5. The second electrode 6a may be formed using the same electrically conductive materials as those used for forming the first electrodes 2a through 2h.

The second strip electrode 6a extends in a direction connecting the front side and the back side of the drawing sheet of FIG. 2, i.e., in the second direction. The width of the second electrode 6a, i.e., the length X along the first direction, is determined by the length of the window 5a of the mask 5 along the first direction.

Subsequently, the aforementioned second mother substrate 3 is cut along a portion corresponding to a line C—C in FIG. 1, i.e., along the first direction, to thereby obtain a plurality of piezoelectric resonators.

Figure 4:
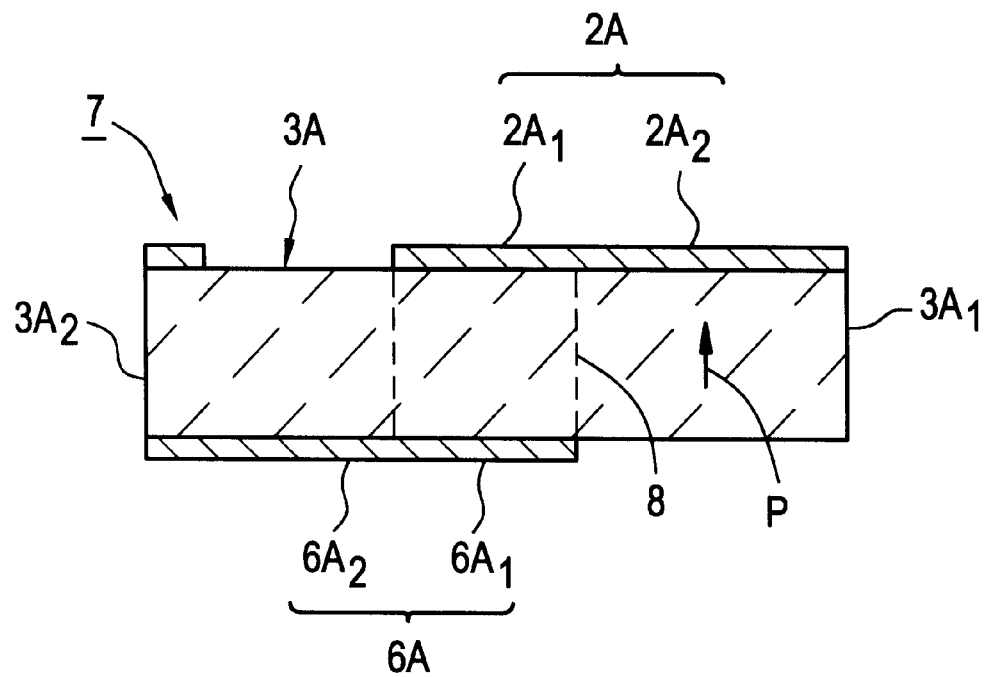
FIG. 4 is a cross-sectional view of a piezoelectric resonator according to the first preferred embodiment adapted to vibrate in a thickness extensional vibration mode.

FIG. 4 is a cross-sectional view of one of the thus-obtained piezoelectric resonators. The piezoelectric resonator 7, obtained by cutting the second mother substrate 3, includes a slender strip-like piezoelectric body 3A having an electrode 2A and an electrode 6A which are formed on the upper surface and the bottom surface thereof, respectively. The electrode 2A is formed by cutting the first strip electrode 2a along the line C—C; similarly, the electrode 6A is formed by cutting the second strip electrode 6a along the line C—C.

The electrode 2A and the electrode 6A overlap each other via the piezoelectric body 3A at a center portion thereof along a length direction. The portions of the electrodes 2A and 6A which overlap each other via the piezoelectric body 3A form an excitation portion 8, and the electrode portions forming the excitation portion 8 form a first excitation electrode $2A_1$ and a second excitation electrode $6A_1$, respectively. A portion of the electrode 2A that extends from the excitation electrode $2A_1$ to one edge surface $3A_1$ of the piezoelectric body 3A forms a first lead electrode $2A_2$ and a portion of the electrode 6A that extends from the excitation portion 8 to one opposite edge surface $3A_2$ of the piezoelectric body 3A forms a second lead electrode $6A_2$.

A resonance frequency of the piezoelectric resonator 7 depends upon the thickness of the piezoelectric body 3A. For this reason, in order to manufacture a piezoelectric resonator having a resonance frequency higher than that of the above piezoelectric resonator 7, a thinner piezoelectric substrate serving as the mother substrate 1 depicted in FIG. 1 is used. In this case, the second strip electrode 6a is disposed on the bottom surface of the second mother substrate 3 by use of the same mask 5 depicted in FIG. 2, so as to provide a second excitation electrode and a lead electrode. This will be described with reference to FIGS. 1 and 3.

Briefly, in order to produce a piezoelectric resonator having a higher resonance frequency, the thickness of the first mother substrate depicted in FIG. 1 is reduced. When the second mother substrate is produced by cutting the first mother substrate, the cutting positions A, are selected so as to obtain an electrode overlapping length L that exactly corresponds to a target resonance frequency. For example, in order to obtain piezoelectric resonators having a higher frequency, the electrode overlapping length L is reduced; i.e., the substrate is cut at positions indicated by chain lines A'.

Figure 3:
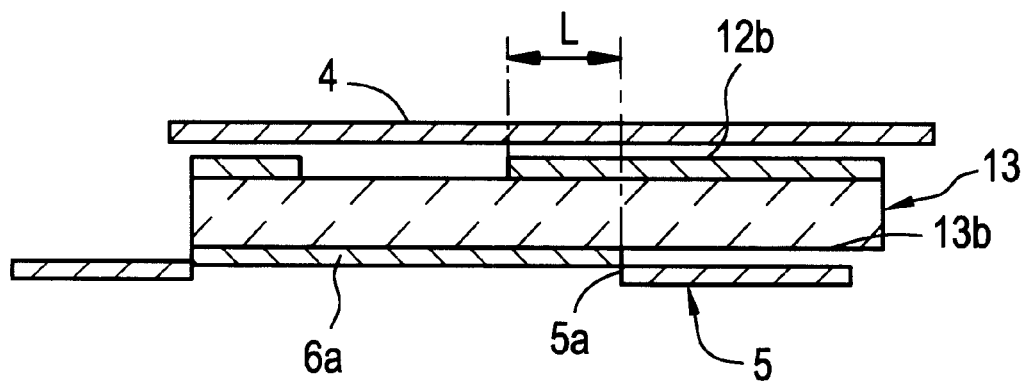
FIG. 3 is a cross-sectional view for illustrating the step of forming an electrode on the bottom surface of a second mother substrate in order to manufacture a piezoelectric resonator according to the first preferred embodiment having a higher resonance frequency.

Thus, a second mother substrate 13 depicted in FIG. 3 is obtained. Since the second mother substrate 13 is produced by cutting at positions indicated by chain lines A', the length along a first direction of a first strip electrode 12b formed on a first major surface 13a is made shorter than that along a first direction of the first strip electrode 2b depicted in FIG. 2.

As shown in FIG. 3, the second strip electrode 6a is disposed on the bottom surface 13b of the second mother substrate 13 by use of a mask 5 identical to the mask 5 shown in FIG. 2. As clearly shown in FIG. 3, the overlapping length L along the first direction of the above electrodes 12b and 6a is less than the overlapping length L along the first direction of the electrodes 2b and 6a as depicted in FIG. 2. Therefore, the second mother substrate 13 depicted in FIG. 3 is cut at portions corresponding to the chain line C—C shown in FIG. 1, to thereby produce piezoelectric resonators having excellent resonance characteristics having an even higher resonance frequency.

In the present preferred embodiment, as described above, a piezoelectric resonator having a desired electrode overlapping length L can be produced by selecting, when the first mother substrate 1 is cut to obtain the second mother substrates 3 and 13, the cutting positions A and A' in accordance with the electrode overlapping length L of a finally obtained piezoelectric resonator. Moreover, in this case, since there is no need to change the second electrode 6a to be formed on the bottom surface for any resonance frequency, the second strip electrode 6a is simply formed on the bottom surface of the second mother substrate by use of only the mask 5.

Therefore, an accurate and ideal electrode overlapping length L corresponding to a variety of resonance frequencies can be realized, and only one kind of a mask 5 is needed to function as a mask for forming the second electrode 6a on the second major surface.

In the above described first preferred embodiment, the piezoelectric resonator 7 adapted to vibrate in a thickness extensional vibration mode is produced by use of the first mother substrate 3, which is polarized in a thickness direction. However, the method of the present invention of manufacturing a piezoelectric resonator is not limited to a piezoelectric resonator adapted to vibrate in a thickness extensional vibration mode, and may include a piezoelectric resonator adapted to vibrate in another vibration mode such as a thickness shear vibration mode.

Figure 5:
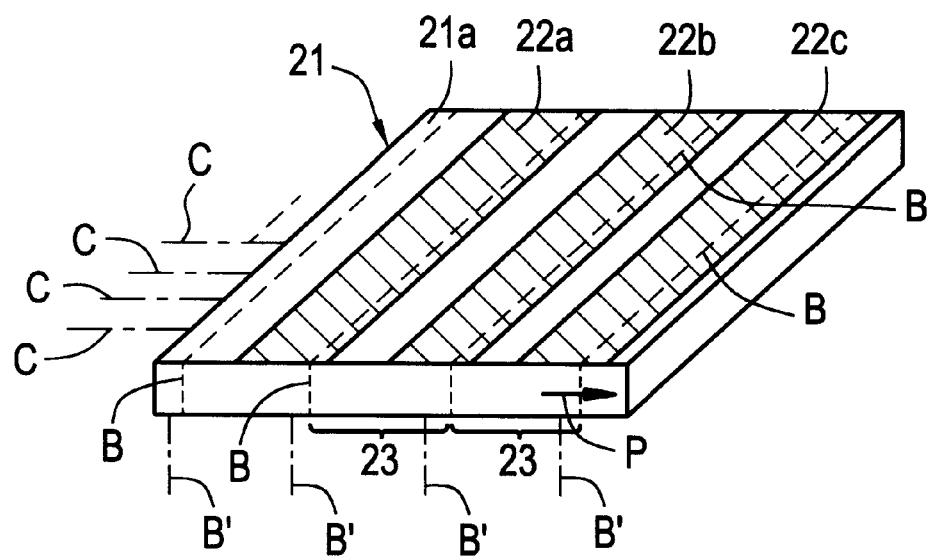
FIG. 5 is a perspective view of a second mother substrate provided in a second preferred embodiment.

A second preferred embodiment is directed to a method of manufacturing an energy-trap type piezoelectric resonator adapted to vibrate in a thickness shear vibration mode. First, a first mother substrate 21, depicted in FIG. 5, is provided. The first mother substrate 21 is preferably formed of, for example, piezoelectric ceramic such as a PZT ceramic. The first mother substrate 21 preferably has a substantially rectangular shape and is polarized in a direction that is substantially parallel to a major surface as indicated by an arrow P in FIG. 5. On a first major surface of the mother substrate 21, i.e., an upper surface 21a, first strip electrodes 22a through 22c are formed so as to be substantially parallel with gaps therebetween.

The above first mother substrate 21 is cut along positions B indicated by broken lines in FIG. 5, to thereby obtain second mother substrates 23. In this case, similar to the case of the first preferred embodiment, the positions B may be selected according to the resonance frequency desired.

Figure 6:
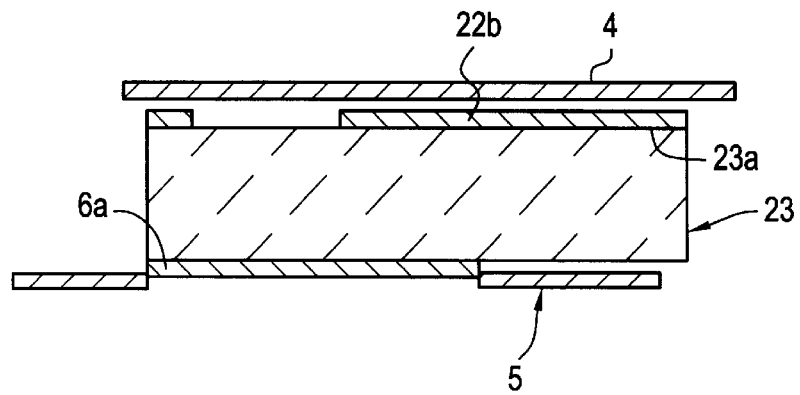
FIG. 6 is a cross-sectional view illustrating the step of forming an electrode on the bottom surface of a second mother substrate cut from a first mother substrate.

Thus, the second mother substrate 23 shown in FIG. 6 is obtained. A first strip electrode 22b is formed on an upper surface 23a of the substrate 23. A mask 4 and a mask 5 are brought into contact with the upper surface 23a and a bottom surface 23b, respectively, and an electrically conductive material is provided through a thin film formation method such as vapor deposition or sputtering, to thereby form a second strip electrode 6a. The second electrode 6a is provided on the bottom surface 23b serving as a second major surface, and the second mother substrate 23 is then cut along portions corresponding to chain lines C—C in FIG. 5, to thereby obtain piezoelectric resonators adapted to vibrate in a thickness shear vibration mode.

Figure 8:
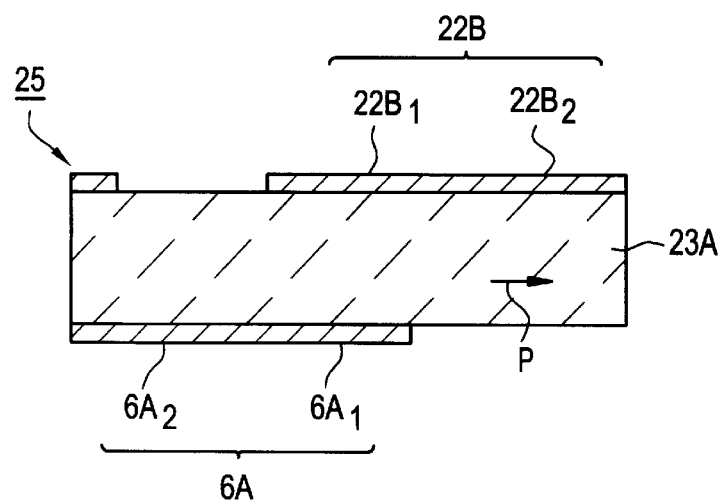
FIG. 8 is a cross-sectional view of a piezoelectric resonator according to the second preferred embodiment which is adapted to vibrate in a thickness extensional vibration mode.

In a manner similar to that described in first preferred embodiment, an energy-trap type piezoelectric resonator 25 of FIG. 8 adapted to vibrate in a thickness shear vibration mode is obtained. The procedure is the same except that the polarization direction of the energy-trap type piezoelectric resonator 25 differs from that of the first mother substrate 21. In FIG. 8, reference numerals 23A and 22B indicate a piezoelectric body and an electrode, respectively, and the resonator has an excitation electrode $22B_1$ and a first lead electrode $22B_2$.

Figure 7:
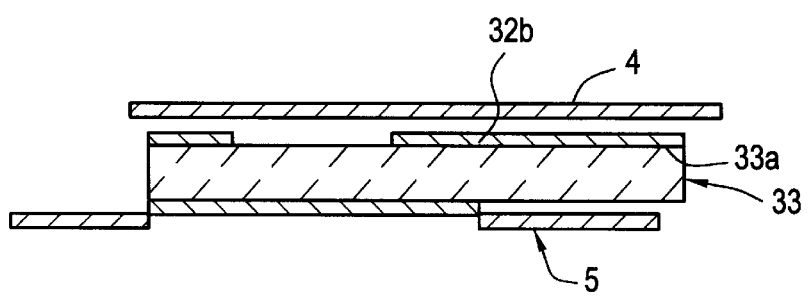
FIG. 7 is a cross-sectional view illustrating the step of forming an electrode on the bottom surface of a second mother substrate in order to manufacture a piezoelectric resonator according to the second preferred embodiment having a higher resonance frequency.

Also in this case, in order to obtain a piezoelectric resonator having a higher frequency, a thinner piezoelectric resonator is used as the first mother substrate 21, and the cutting positions are shifted to those depicted by B' in FIG. 5. Thus, a second mother substrate 33 depicted in FIG. 7 is obtained. In the second mother substrate 33, because of the changes in the above cutting positions, the length along a first direction of a first strip electrode 32a provided on an upper surface 33a is less than that along a first direction of the first strip electrode 22a depicted in FIG. 6.

Subsequently, a strip electrode 6a is provided on a bottom surface 33b by use of a mask 5, and the substrate is cut at portions corresponding to chain lines C in FIG. 5, to thereby obtain piezoelectric resonators.

Also in this case, the strip electrode 6a is provided on the bottom surface 33b of the second mother substrate 33 by use of the same mask 5, and an electrode overlapping length L can be optimized by changing the above cutting position B to position B'.

Thus, also in the above described second preferred embodiment, there can be manufactured, without fail, piezoelectric resonators having an optimum electrode overlapping length corresponding to a variety of resonance frequencies.

A method of manufacturing a piezoelectric resonator in accordance with a third preferred embodiment will next be described with reference to FIGS. 9 through 12.

Figure 9:
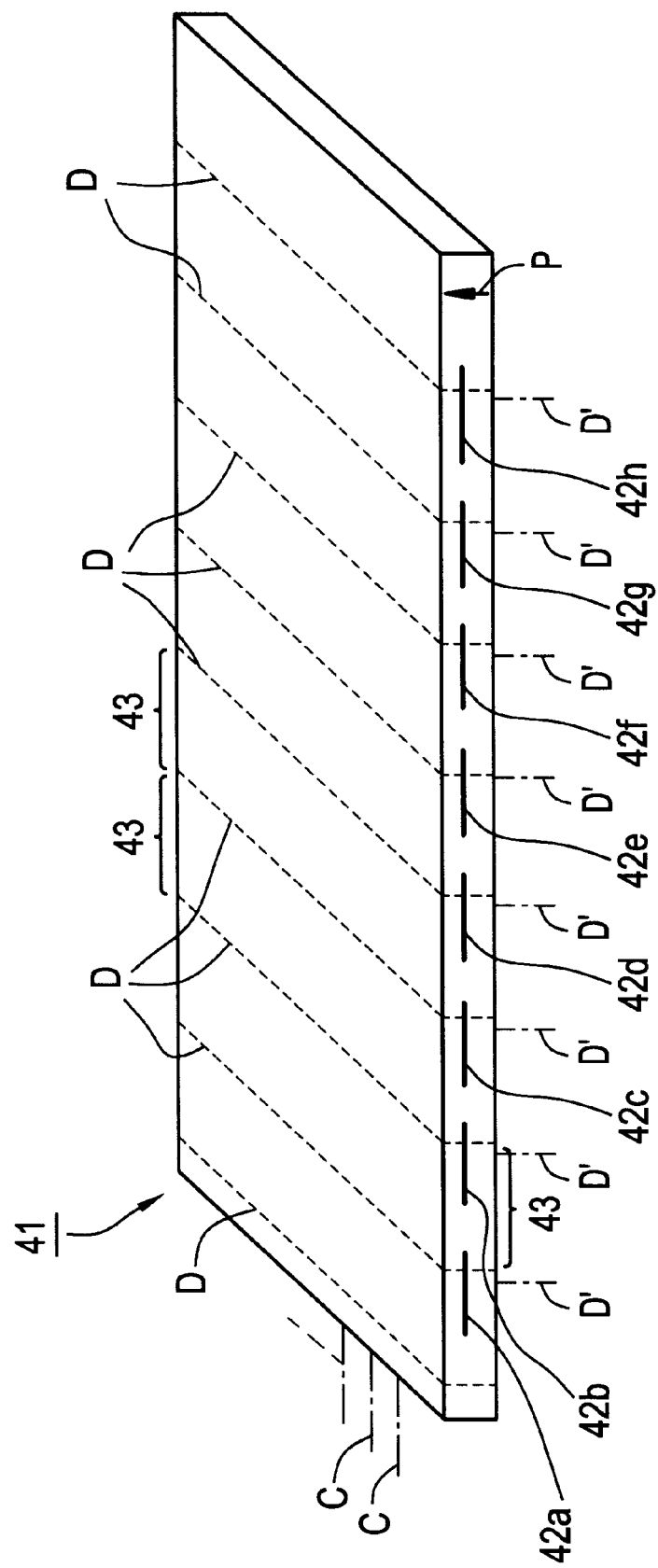
FIG. 9 is a perspective view depicting a first mother substrate provided in a third preferred embodiment.

First, a mother substrate 41 depicted in FIG. 9 is prepared. The mother substrate 41 is formed of, for example, a piezoelectric ceramic such as a PZT ceramic and preferably has a substantially rectangular plate-like shape. The mother substrate 41 is homogeneously polarized in a thickness direction.

Within the mother substrate 41, a plurality of internal electrodes 42a through 42h are formed at an intermediate height, to thereby function as first strip electrodes. Each of the internal electrodes 42a through 42h has a strip shape which extends in a second direction that is substantially perpendicular to a first direction of a line extending between an excitation electrode and a lead electrode in a finally obtained piezoelectric resonator. The internal electrodes 42a through 42h are formed so as to have a planar shape similar to that of strip electrodes 2a through 2h formed on the first mother substrate in the first preferred embodiment.

The above-mentioned internal electrodes 42a through 42h extend in the second direction, and are arranged to have gaps therebetween.

The internal electrodes 42a through 42h may be formed of an appropriate electrically conductive material, and the first mother substrate 41 having the internal electrodes 42a through 42h may be produced through, for example, a known technique for firing a laminated ceramic compact.

The mother substrate 41 is cut along cutting positions indicated by broken lines D, to thereby obtain second mother substrates 43. As mentioned below, the cutting positions D are selected so as to realize a desired electrode overlapping length.

Figure 10:
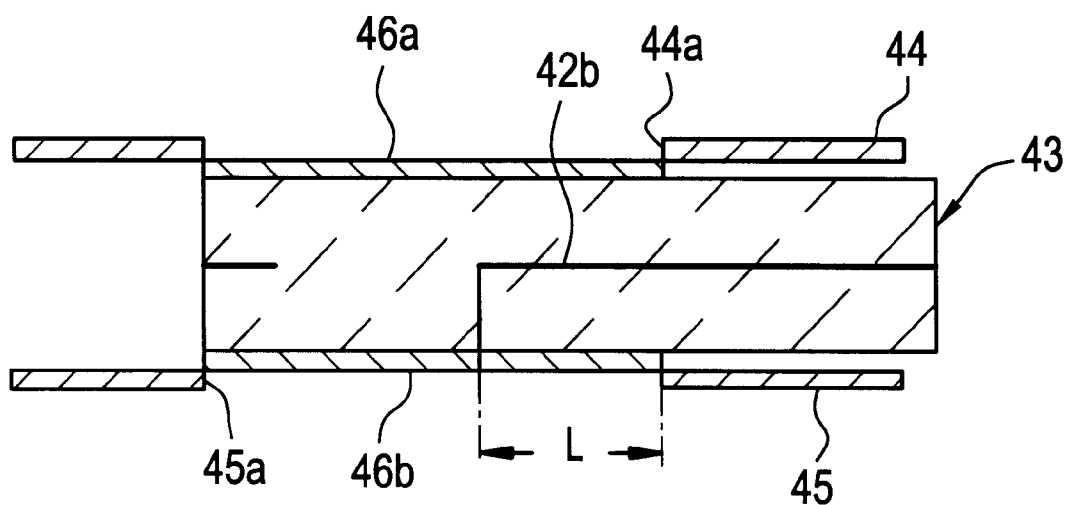
FIG. 10 is a cross-sectional view illustrating the step of forming an electrode on the bottom surface of a second mother substrate which is cut from a first mother substrate.

As shown in a cross-sectional view in FIG. 10, a mask 44 and a mask 45 are brought into contact with an upper surface 43a serving as a first major surface and a bottom surface 43b serving as a second major surface of the second mother substrate 43, respectively, and an electrically conductive material is applied via a method such as vapor deposition or sputtering, to thereby form second strip electrodes 46a and 46b.

The masks 44 and 45 have windows 44a and 45a, respectively. In this case, the mask 44 and the mask 45 preferably have identical shapes.

Thus, the second strip electrodes 46a and 46b are provided on the upper surface 43a and the bottom surface 43b of the second mother substrate 43, respectively.

The second strip electrodes 46a and 46b extend in a direction into the drawing sheet as viewed in FIG. 10, i.e., in the second direction.

Figure 12:
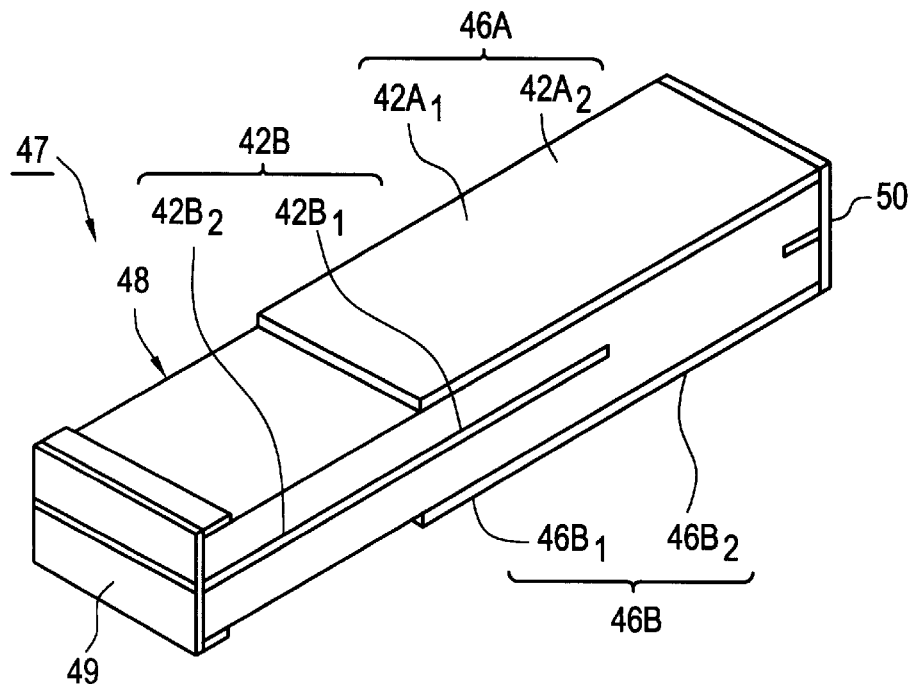
FIG. 12 is a perspective view depicting a piezoelectric resonator according to the third preferred embodiment which is adapted to vibrate in a thickness extensional vibration mode.
Figure 13:
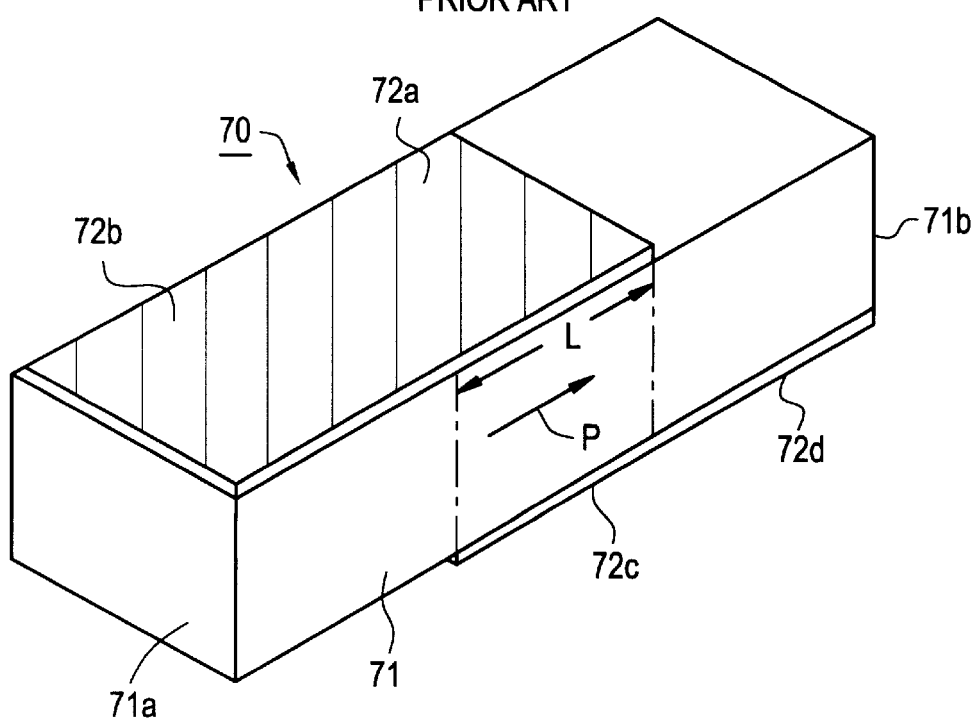
FIG. 13 is a perspective view illustrating a conventional energy-trap type piezoelectric resonator.

Next, the second mother substrate 43 is cut at portions corresponding to chain lines C in FIG. 9, to thereby obtain a piezoelectric resonator 47 depicted in a cross-sectional view in FIG. 12. In the piezoelectric resonator 47, an internal electrode 42B is disposed inside of a piezoelectric body 48. The internal electrode 42B is formed by cutting the above internal electrode 42b.

On the upper surface and the bottom surface of the piezoelectric body 48, the electrodes 46A and 46B are formed through cutting the above-described second strip electrodes 46a and 46b. The electrodes 46A and 46B include excitation electrode portions 46A, and 46B, overlapping with the internal electrode 42B in a thickness direction, respectively; and lead electrodes $46A_2$ and $46B_2$ extending from the excitation electrode portions $46A_1$ and $46B_1$, respectively. Reference numerals 49 and 50 indicate connecting electrodes, which are formed through an appropriate method for forming an electrically conductive film after the above step.

Therefore, the piezoelectric resonator 47 operates as a piezoelectric generator adapted to vibrate in a third harmonic of a thickness extensional vibration mode through application of an AC voltage between the excitation electrode portion $42B_1$ of the internal electrode 42B and the excitation electrodes $46A_1$ and $46A_2$. Reference numeral $42B_2$ indicates a lead electrode portion.

Also, in the present preferred embodiment, in order to lower the resonance frequency, the thickness of the first mother substrate 41 is reduced. In addition, in order to obtain excellent resonance characteristics, the cutting positions D are shifted easily.

Figure 11:
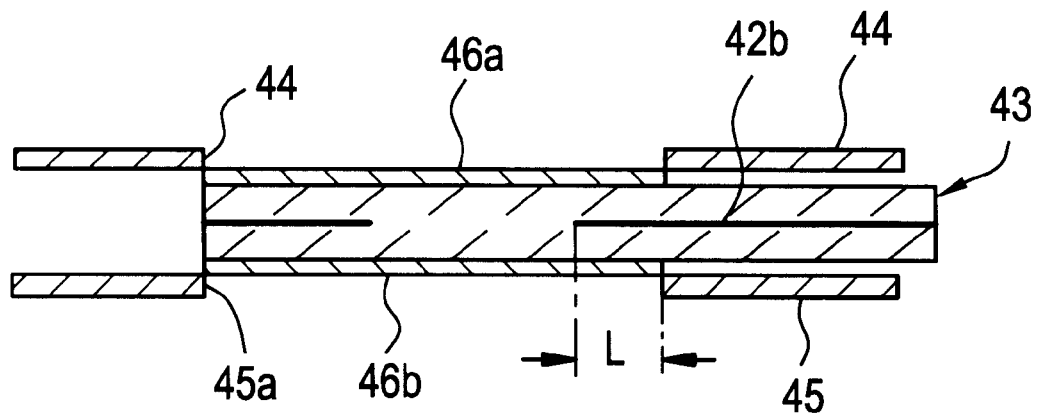
FIG. 11 is a cross-sectional view illustrating the step of forming an electrode on the bottom surface of a second mother substrate in order to produce a piezoelectric resonator of a third preferred embodiment having a higher resonance frequency.

Specifically, as shown in FIG. 9, in order to produce the thin second mother substrate 43A, the length in the first direction of the internal electrode 42b is shortened by cutting at a cutting position D' located to the left with respect to the cutting position D shown in FIG. 9. Thus, as shown in FIG. 11, second strip electrodes 46a and 46b are formed by use of the same masks 44 and 45 shown in FIG. 10, to thereby produce a piezoelectric resonator having a shortened electrode overlapping length.

Although the above described third preferred embodiment shows a piezoelectric resonator in which only one layer of an internal electrode is formed, the present invention is also applicable to a piezoelectric resonator adapted to vibrate in a harmonic of a thickness extensional vibration mode and in which more than one layer of an internal electrode is disposed.

While the invention has been particularly shown and described with reference to preferred embodiments thereof, it will be understood by those skilled in the art that the forgoing and other changes in form and details may be made therein without departing from the spirit of the invention.

What is claimed is:

1. A method of manufacturing a piezoelectric resonator including a piezoelectric body, a plurality of first and second excitation electrodes overlapping each other with the piezoelectric body disposed therebetween so as to define an excitation portion, a first lead electrode extending from the corresponding first excitation electrodes to an edge portion of the piezoelectric body and connected to a first electric potential, and a second lead electrode extending to a direction opposite from the direction which said first lead electrode is extended and connected to a second electric potential, the method comprising the steps of:

providing a first mother substrate having a plurality of first strip electrodes arranged with gaps therebetween along a first direction on the first mother substrate, the first strip electrodes each extending along a second direction, the first direction extending along a direction of a line which extends between the excitation electrodes and lead electrodes and the second direction is substantially perpendicular to the first direction;

obtaining a second mother substrate by cutting said first mother substrate along said second direction such that a length of the first strip electrodes in said first direction is set according to a target resonance frequency;

using a mask to form a plurality of second strip electrodes on a major surface of the second mother substrate, each of said second strip electrodes constituting said second excitation electrode and said second lead electrode connected to said second electric potential along said second direction; and obtaining a plurality of piezoelectric resonators by cutting the second mother substrate along said first direction.

2. The method according to claim 1, wherein the piezoelectric body has an elongated strip shape and a longitudinal direction of the piezoelectric body corresponds to the first direction.

3. The method according to claim 1, wherein said plurality of first strip electrodes are disposed on a first major surface of said first mother substrate; and said plurality of second strip electrodes are disposed on a second major surface of said second mother substrate in the step of forming said plurality of second strip electrodes using a mask.

4. The method according to claim 1, wherein said first mother substrate is polarized in a thickness direction thereof to thereby define a piezoelectric resonator adapted to vibrate in a thickness extensional vibration mode.

5. The method according to one of claim 1, wherein the first mother substrate is polarized in said first direction to thereby provide a piezoelectric resonator adapted to vibrate in a shear mode.

6. The method according to claim 1, wherein said first strip electrodes are arranged to function as internal electrodes, said second strip electrodes are disposed on first and second major surfaces of said second mother substrate in the step of forming said plurality of second strip electrodes using a mask, to thereby define a piezoelectric resonator adapted to vibrate in a harmonic of a thickness extensional vibration mode.

7. The method according to claim 1, wherein if the target resonance frequency is changed, the mask using in the step of forming a plurality of second strip electrodes is not changed.

8. The method according to claim 1, wherein if the target resonance frequency is changed to a new target resonance frequency, a cutting position of cutting said first mother substrate along said second direction is changed in accordance with the new target resonance frequency.

9. The method according to claim 1, further comprising the step of changing a position where said first mother substrate is cut along said second direction such that a length of the first strip electrodes is reduced so as to reduce an overlapping area of the first and second strip electrodes.

10. A method of manufacturing a piezoelectric resonator including a piezoelectric body, a plurality of first and second excitation electrodes overlapping each other with the piezoelectric body disposed therebetween so as to define an excitation portion, a first lead electrode extending from the corresponding first excitation electrodes to an edge portion of the piezoelectric body and connected to a first electric potential, and a second lead electrode extending to a direction opposite from the direction which said first lead electrode is extended and connected to a second electric potential, the method comprising the steps of:

providing a first mother substrate having a plurality of first strip electrodes arranged with gaps therebetween along a first direction on the first mother substrate, the first strip electrodes each extending along a second direction, the first direction extending along a direction of a line which extends between the excitation electrodes and lead electrodes and the second direction is substantially perpendicular to the first direction;

obtaining a second mother substrate by cutting said first mother substrate along said second direction such that a position of cutting said first mother substrate is selected according to a target resonance frequency;

using a mask to form a plurality of second strip electrodes on a major surface of the second mother substrate, each of said second strip electrodes constituting said second excitation electrode and said second lead electrode connected to said second electric potential along said second direction; and obtaining a plurality of piezoelectric resonators by cutting the second mother substrate along said first direction.

11. The method according to claim 10, wherein the piezoelectric body has an elongated strip shape and a longitudinal direction of the piezoelectric body corresponds to the first direction.

12. The method according to claim 10, wherein said plurality of first strip electrodes are disposed on a first major surface of said first mother substrate; and said plurality of second strip electrodes are disposed on a second major surface of said second mother substrate in the step of forming said plurality of second strip electrodes using a mask.

13. The method according to claim 10, wherein said first mother substrate is polarized in a thickness direction thereof to thereby define a piezoelectric resonator adapted to vibrate in a thickness extensional vibration mode.

14. The method according to one of claim 10, wherein the first mother substrate is polarized in said first direction to thereby provide a piezoelectric resonator adapted to vibrate in a shear mode.

15. The method according to claim 10, wherein said first strip electrodes are arranged to function as internal electrodes, said second strip electrodes are disposed on first and second major surfaces of said second mother substrate in the step of forming said plurality of second strip electrodes using a mask, to thereby define a piezoelectric resonator adapted to vibrate in a harmonic of a thickness extensional vibration mode.

16. The method according to claim 10, wherein if the target resonance frequency is changed, the mask using in the step of forming a plurality of second strip electrodes is not changed.

17. The method according to claim 10, wherein if the target resonance frequency is changed to a new target resonance frequency, a cutting position of cutting said first mother substrate along said second direction is changed in accordance with the new target resonance frequency.

18. The method according to claim 10, further comprising the step of changing a position where said first mother substrate is cut along said second direction such that a length of the first strip electrodes is reduced so as to reduce an overlapping area of the first and second strip electrodes.

* * * * *